United States Patent [19]
Craft

[11] Patent Number: 5,877,711
[45] Date of Patent: Mar. 2, 1999

[54] METHOD AND APPARATUS FOR PERFORMING ADAPTIVE DATA COMPRESSION

[75] Inventor: David John Craft, Austin, Tex.

[73] Assignee: International Business Machines Corporation, Armonk, N.Y.

[21] Appl. No.: 934,234

[22] Filed: Sep. 19, 1997

[51] Int. Cl.$^6$ ................................................. H03M 7/40
[52] U.S. Cl. ................................................. 341/51; 341/87
[58] Field of Search ................................. 341/57, 50, 59, 341/67, 95, 106, 87

[56] References Cited

U.S. PATENT DOCUMENTS

| | | | |
|---|---|---|---|
| 5,016,009 | 5/1991 | Whiting et al. | 341/67 |
| 5,608,396 | 3/1997 | Cheng et al. | 341/50 |
| 5,612,693 | 3/1997 | Craft et al. | 341/51 |
| 5,617,517 | 4/1997 | Chi | 395/114 |
| 5,627,534 | 5/1997 | Craft et al. | 341/87 |
| 5,652,878 | 7/1997 | Craft et al. | 395/601 |

OTHER PUBLICATIONS

QIC Development Standard, Adaptive Lossless Data Compression (ALDC), QIC–154, Revision A, Mar. 10, 1994.

Jacob Ziv and Abraham Lempel, A Universal Algorithm for Sequential Data Compression, IEEE Transactions on Information Theory, vol. IT–23, No. 3, May 1977.

James A. Storer and Thomas G. Szymanski, Data Compression via Textual Substitution, Journal of the Association for Computing Machinery, vol. 29, No. 4, Oct. 1982, pp. 928–951.

Timothy C. Bell, Better OPM/L Text Compression, IEEE Transactions on Communications, vol. Com–34, No. 12, Dec. 1986.

*Primary Examiner*—Brian Young
*Assistant Examiner*—Peguy JeanPierre
*Attorney, Agent, or Firm*—Casimer K. Salys; Antony P. Ng; Andrew J. Dillon

[57] ABSTRACT

A method for encoding an input data stream of source symbols to produce an output sequence of pointers is disclosed. An initial part of the input data stream is encoded as a LITERAL_POINTER by a compressor. A LITERAL_POINTER includes at least one data byte from the data stream. A subsequent part of the input data stream is encoded as a COPY_POINTER. The COPY_POINTER includes a count and a displacement pointing to a history-buffer within the compressor. All succeeding data bytes from the input data stream are encoded as LITERAL_POINTERs and COPY_POINTERs in an alternating fashion, such that an encoded output sequence output by the compressor includes a string of pointers alternating between LITERAL_POINTERs and COPY_POINTERs.

20 Claims, 4 Drawing Sheets

LITERAL_DATA ⟶ If L_CTR value is 3, then go to (1), else go to (2);

(1) output "11";
    output data byte from L_DATA[0];
    output data byte from L_DATA[1];
    output data byte from L_DATA[2];
    store LITERAL_DATA to L_DATA[0];
    set L_CTR equal to 1;
    done;

(2) save byte in L_DATA indexed by L_CTR;
    increment L_CTR value by 1;
    done;

COPY_POINTER ⟶ If L_CTR value is 3, output "11", then go to (3);
    If L_CTR value is 2, output "10", then go to (3);
    If L_CTR value is 1, output "01", then go to (3);
    If L_CTR value is 0, output "00", then go to (4);

(3) output data byte from L_DATA[0];
    if L_CTR > 1, then output data byte from L_DATA[1];
    if L_CTR > 2, then output data byte from L_DATA[2];
    output "00"; go to (4);

(4) set L_CTR = 0; encode and output COPY_POINTER;
    done.

*Fig. 2*

LITERAL_DATA ⟶ If L_CTR value is 2, then go to (1), else go to (2);

(1) output "11";
    output data byte from L_DATA[0];
    output data byte from L_DATA[1];
    store LITERAL_DATA to L_DATA[0];
    set L_CTR equal to 1;
    done;

(2) save byte in L_DATA indexed by L_CTR;
    increment L_CTR value by 1;
    done;

COPY_POINTER ⟶ If L_CTR value is 2, output "11", then go to (3);
    If L_CTR value is 1, output "10", then go to (3);
    If L_CTR value is 0, output "0", then go to (4);

(3) output data byte from L_DATA[0];
    if L_CTR > 1, then output data byte from L_DATA[1];
    output "00"; go to (4);

(4) set L_CTR = 0; encode and output COPY_POINTER;
    done.

*Fig. 3*

METHOD AND APPARATUS FOR PERFORMING ADAPTIVE DATA COMPRESSION

BACKGROUND OF THE INVENTION

1. Technical Field

The present invention relates to a method and apparatus for compressing data in general, and in particular to a method and apparatus for performing adaptive data compression. Still more particularly, the present invention relates to a method and apparatus for improving data compression efficiency of Lempel-Ziv 1 variants.

2. Description of the Prior Art

The well-known Lempel-Ziv coding scheme was first suggested by J. Ziv and A. Lempel in "A Universal Algorithm for Sequential Data Compression," IEEE Trans. Inform. Theory, vol. IT-23, no. 3, pp.337–343, 1977. The classical implementation which utilized a variant of the original Ziv-Lempel coding scheme was first suggested by J. Storer and T. Symanski in "Data Compression via Textual Substitution," J. ACM, vol. 29, no. 4, pp 928–951, 1982, and was subsequently implemented by T. Bell (see "Better OPM/L Text Compression," IEEE Trans. Comm., vol. COM-34, no. 12, 1986), who called his implementation of this coding scheme LZSS.

The LZSS scheme permits the output of a Lempel-Ziv compressor to be an arbitrary mixture of code symbols called LITERAL_POINTERs and COPY POINTERs. The LITERAL_POINTER contains one single embedded data symbol, and the COPY_POINTER contains two elements, namely, a SYMBOL_COUNT and a DISPLACEMENT (or OFFSET).

Each LITERAL_POINTER is processed by simply extracting the embedded data symbol with a decompressor. The extracted data symbol is then output from the decompressor, and is also copied back to the current location of a history-buffer for update. COPY_POINTERs are processed by extracting and decoding the SYMBOL_COUNT and the DISPLACEMENT value. Then, some number of symbols, as specified by the SYMBOL_COUNT value, are copied from the history-buffer of the decompressor. These symbols are copied sequentially, one symbol at a time, starting from a history-buffer location specified by the DISPLACEMENT value. As each symbol is copied to the output of the decompressor, it is also copied back to the history-buffer for update, in the same way as for a LITERAL_POINTER.

As in most implementations of this kind of Lempel-Ziv 1 variant (to distinguish it from a dictionary-based scheme known as Lempel-Ziv 2, also proposed by Lempel and Ziv), LZSS utilizes a variable-length SYMBOL_COUNT coding scheme because shorter count values tend to be much more frequent than longer ones. Also, LZSS utilizes a single flag bit to distinguish between encoded LITERAL_POINTERs and the COPY_POINTERs.

In recent years, there is an adaptive compression algorithm known as Adaptive Lossless Data Compression (ALDC) that is widely utilized for general purpose data compression within computers and associated peripheral devices. ALDC, also a Lempel-Ziv 1 variant, is described in full detail in "QIC Development Standard QIC-154," Rev. A, 10 Mar 94, Quarter-Inch Cartridge Drive Standards, Inc. This document, also available via internet at "http://www.qic.org," is incorporated herein by reference.

If ALDC encounters incompressible data (an input data stream of random bytes, for example), the output will largely consist of LITERAL_POINTERS, and it is not likely the incoming random data bytes will contain any extensive repeats of the preceding data sequences already stored in a history-buffer. As in the LZSS coding scheme, ALDC utilizes a single flag bit at the start of a LITERAL_POINTER and a COPY_POINTER for distinguishing them from each other. This will result in an expansion of about 12.5% for ALDC because each incoming random data byte value (of 8 bits) must be encoded as a LITERAL_POINTER, which for ALDC is a single "0" bit followed by 8 literal data bits. Thus, ALDC expands each 8 incoming data bits to 9 data bits for any data having no matching string found in the history-buffer.

The present disclosure describes an improved method and apparatus for performing adaptive data compressions without utilizing any flag bits, such that the compression ratio may be better than those that require a flag bit for distinguishing a LITERAL_POINTER and a COPY_POINTER, such as LZSS and ALDC, as described above.

SUMMARY OF THE INVENTION

In view of the foregoing, it is therefore an object of the present invention to provide an improved method and apparatus for compressing data.

It is another object of the present invention to provide an improved method and apparatus for performing adaptive data compression.

It is yet another object of the present invention to provide an improved method and apparatus for enhancing data compression efficiency of Lempel-Ziv 1 variants.

In accordance with a method and apparatus of the present invention, an initial part of an input data stream of source symbols is encoded as a LITERAL_POINTER by a compressor. A LITERAL_POINTER includes at least one data byte from the data stream. A subsequent part of the input data stream is encoded as a COPY_POINTER. The COPY_POINTER includes a count and a displacement pointing to a history-buffer within the compressor. All succeeding data bytes from the input data stream are encoded as LITERAL_POINTERs and COPY_POINTERs in an alternating fashion, such that an encoded output sequence output by the compressor includes a string of pointers alternating between LITERAL_POINTERs and COPY_POINTERs. As such, a flag bit is not required to distinguish between a LITERAL_POINTER and a COPY_POINTER as in the prior art.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein:

FIG. 1b is a block diagram of a data decompressor unit in which a preferred embodiment of the present invention may be incorporated;

FIG. 2 is a high-level pseudo-code of a fixed length LITERAL_COUNT encoding scheme in accordance with a preferred embodiment of the present invention; and FIG. 3 is a high-level pseudo-code of a variable length LITERAL_COUNT encoding scheme in accordance with a preferred embodiment of the present invention.

DETAILED DESCRIPTION OF A PREFERRED EMBODIMENT

The present invention may be implemented within a data compressor and data decompressor. It is understood by those skilled in the art that the present invention may be implemented in either hardware or software.

I. ENCODER AND DECODER

Figure 1A:
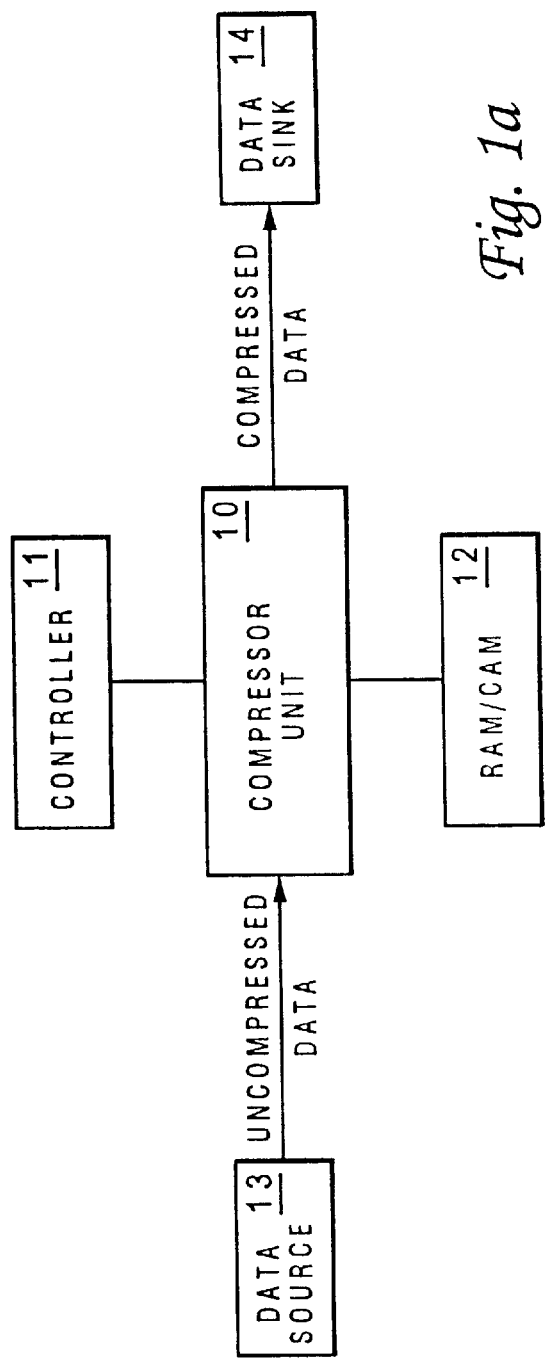
FIG. 1a is a block diagram of a compressor unit in which a preferred embodiment of the present invention may be incorporated.
Figure 16:
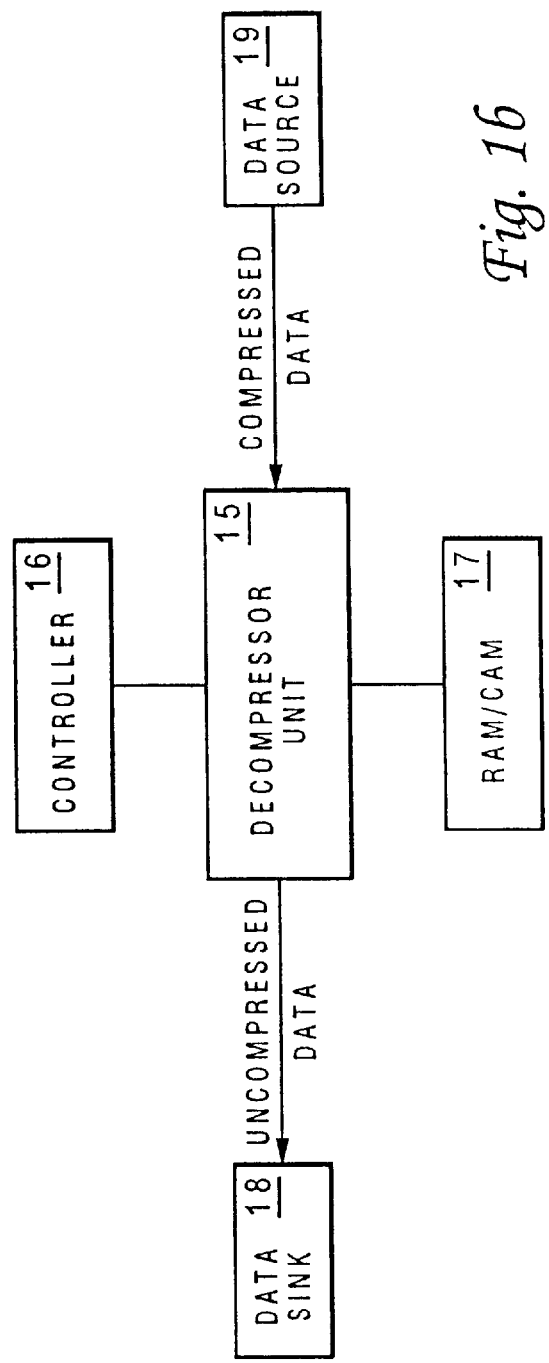

Referring now to the drawings and in particular to FIG. 1a, there is depicted a block diagram of a data compressor unit in which a preferred embodiment of the present invention may be incorporated. As shown, compressor unit 10 is coupled to a controller 11 and a random-access memory (RAM) or content-addressable memory (CAM) 12. All data structures associated with the compression algorithm, such as a history-buffer, are maintained within RAM/CAM 12. As such, the optimal size of RAM/CAM 12 largely depends on the size of the history-buffer. During operation, an uncompressed data stream is first received by compressor unit 10 from a data source 13. After data-encoding, compressed data stream is then transmitted to a data sink 14.

Compressor unit 10 processes the uncompressed data stream one data byte at a time. Each processed data byte is also sequentially copied into a history-buffer, displacing the oldest data byte if the history-buffer is already full. Thus, a sequential copy of the most recent portion of the uncompressed data stream is always available in the history-buffer.

The compression process includes an examination of the incoming data stream to identify any sequence or string of data bytes that already exist within the history-buffer. If an identical string of data bytes is available within the history-buffer, this matching string of data bytes can be encoded as a two-element COPY_POINTER, containing a byte symbol count and a displacement (or offset) within the history-buffer. Thus, when the string of data bytes can be encoded by a COPY_POINTER in fewer bits of information than normally required, compression is achieved. However, if an incoming data byte sequence does not match any place within the history-buffer, this incoming data byte sequence will be encoded as a LITERAL that explicitly represents it.

Referring now to FIG. 1b, there is depicted a block diagram of a data decompressor unit in which a preferred embodiment of the present invention may be incorporated. As shown, decompressor unit 15 is coupled to a controller 16 and a RAM/CAM 17. Similar to RAM/CAM 12, all data structures for decompressor unit 15 are maintained within RAM/CAM 17 . During operation, a compressed data stream is first received by decompressor unit 15 from data source 19. After data-decoding, an uncompressed data stream will then be transmitted from decompressor unit 15 to a data sink 18.

On the other hand, a COPY_POINTER is processed by first decoding the specified byte count and the displacement of the COPY_POINTER. Subsequently, this string of data byte values is read, one byte at a time, from the history-buffer within decompressor unit 15. Each data byte value is then copied into the history-buffer and output as a decoded data byte, before the next data byte value is accessed. Once the entire string of data bytes has been processed in this manner, the history-buffer within decompressor unit 15 will be identical to the history-buffer within compressor unit 10.

II. ENCODING SCHEME

The present invention differs from many Lempel-Ziv 1 variants mainly in the encoding scheme utilized to represent LITERALs and COPY_POINTERS. An improved coding scheme in accordance with a preferred embodiment of the present invention is described as follows:

(1) Encoded output from a compressor unit always begins with a LITERAL_POINTER. This is then followed by an alternating sequence of COPY_POINTERs and LITERAL_POINTERs. For example, <LITERAL_POINTER> <COPY_POINTER> <LITERAL_POINTER> <COPY_POINTER> . . . <LITERAL_POINTER> <COPY_POINTER> <LITERAL_POINTER> <COPY_POINTER>.

(2) A LITERAL_POINTER includes a LITERAL_COUNT field followed by a corresponding number of LITERAL_DATA symbols (usually in bytes), as follows: <LITERAL_POINTER>=[<LITERAL_COUNT><LITERAL_DATA>]

(3) A LITERAL_COUNT field has three allowed values-0, 1, and 2. These three values determine the number of LITERAL_DATA symbols that follow. The encoding format of LITERAL_COUNT field is given in Table I.

(4) A LITERAL_COUNT value of 0 denotes a NULL_LITERAL, and there is no following LITERAL_DATA symbol (Table I, row 1). This is utilized to separate two consecutive COPY_POINTERs, so there is no conflict with Rule (1) above.

(5) A LITERAL_COUNT value of 1 denotes one LITERAL_DATA symbol followed by a COPY_POINTER (Table I, row 2).

(6) A LITERAL_COUNT value of 2 denotes two LITERAL_DATA symbols followed by another LITERAL_POINTER (Table I, row 3), encoded as described in Rules (2) through (5) above.

(7) A COPY_POINTER includes a SYMBOL_COUNT and a DISPLACEMENT field, encoded exactly as in ALDC, utilizing the same reserved Control Word and End_Marker values, but without the overhead of a preceding flag bit.

TABLE I

| Code | Value | followed by |
| --- | --- | --- |
| 0 | 0 | <COPY_PTR> |
| 10 | 1 | <LITERAL_DATA> <COPY_PTR> |
| 11 | 2 | <LITERAL_DATA> <LITERAL_DATA> <LITERAL_PTR> |

Note that the encoding scheme under a preferred embodiment of the present invention does not require a flag bit to distinguish a LITERAL_POINTER from a COPY_POINTER, as in prior art Lempel-Ziv 1 variants. In addition, this specific encoding scheme also requires minimal buffering within the compressor unit, e.g. on the order of two symbols (in bytes).

The above encoding scheme as described employs a variable length encoding scheme, the LITERAL_COUNT can be either one or two bits, providing a range of values 0 through 2. Also, the SYMBOL_COUNT within the COPY_POINTER may vary in size from 2 to 12 bits, and can represent a range of 286 values in total. The last 16 consecutive code values in the range, all 12-bit numbers, may be reserved for control usage. Hence, there are 270 length codes available, which allow encoding of the matching string lengths from 2 through 271 bytes. Any matching single byte strings will not be encoded as COPY_POINTERS.

In addition, the history-buffer must be cleared at the start of an operation. Data is always stored in an ascending order within the history-buffer, starting from the zero address location. This location, or displacement value, must reset to zero each time the entire history-buffer is filled, and the update location is not utilized for either initiating or continuing string matching operations.

III. IMPLEMENTATIONS

With reference now to FIG. 2, there is illustrated a high-level pseudo-code of a fixed length LITERAL_COUNT encoding scheme in accordance with a preferred embodiment of the present invention. In this implementation, for example, a two-bit counter L_CTR and three eight-bit L_DATA[] buffers are utilized. For processing a LITERAL_DATA symbol, if L_CTR value is equal to 3, then output "11", output data byte from L_DATA[0], output data byte from L_DATA[1], output data byte from L_DATA[2], store the LITERAL_DATA byte to L_DATA[0], and set L_CTR equal to 1. However, if the L_CTR value is not equal to 3, then save the byte in L_DATA indexed by L_CTR, and increment L_CTR value by 1.

For encoding a COPY_POINTER any previously saved LITERAL_DATA bytes must first be encoded and output. If L_CTR value is equal to 3, then output "11" and go to step (3). If L_CTR value is equal to 2, then output "10" and go to step (3). If L_CTR value is equal to 1, then output "01" and go to step (3). If L_CTR value is 0, then output "00" and go to step (4). In step (3), output data byte from L_DATA[O]; if L_CTR >1, then output data byte from L_DATA[1]; if L_CTR >2, then output data byte from L_DATA[2]; output "00" and go to step (4). In step (4), set L_CTR=0; then encode and output the COPY_POINTER.

Referring now to FIG. 3, there is illustrated a high-level pseudo-code of a variable length LITERAL_COUNT encoding scheme in accordance with a preferred embodiment of the present invention. In this implementation, for example, a two-bit counter L_CTR and two eight-bit L_DATA[] buffers are utilized. For encoding a LITERAL_DATA, if L_CTR value is equal to 2, then output "11," output data byte from L_DATA[0], output data byte from L_DATA[1], store LITERAL_DATA to L_DATA[0], and set L_CTR equal to 1. However, if the L_CTR value is not equal to 2, then save data byte in L_DATA indexed by L_CTR, and increment L_CTR value by 1.

For encoding a COPY_POINTER any previously saved LITERAL_DATA bytes must first be encoded and output. If L_CTR value is equal to 2, then output "11" and go to step (3). If L_CTR value is equal to 1, then output "10" and go to step (3). If L_CTR value is equal to 0, then output "0" and go to step (4). In step (3), output data byte from L_DATA[0]; if L_CTR >1, then output data byte from L_DATA[1]; output "0" and go to step (4). In step (4), set L_CTR =0; then encode and output the COPY_POINTER.

As has been described, the present invention provides an improved method and apparatus for performing adaptive data compression within a compressor unit. Under the present invention, data bytes from an input data stream are encoded as LITERAL_POINTERs and COPY_POINTERs in an alternating order. As a result, the output sequence from the compressor unit includes a string of pointers alternating between LITERAL_POINTERs and COPY_POINTERs, with a LITERAL_POINTER at the start. A LITERAL_POINTER may now contain none, or some number of literal data bytes or symbols, preceded by a LITERAL_COUNT. The maximum allowed value of the LITERAL_COUNT is used to repetitively concatenate as many LITERAL_POINTERs as may be necessary to encode an arbitrarily long sequence of LITERAL_DATA symbols. In addition, a two-bit fixed length or one/two bit variable length encoding scheme may be utilized to encode a LITERAL_COUNT within a LITERAL_POINTER.

It is also important to note that although the present invention has been described in the context of a hardware compressor, those skilled in the art will appreciate that the mechanisms of the present invention can be implemented in software and be distributed as a program product in a variety of forms, and that the present invention applies equally regardless of the particular type of signal bearing media utilized to actually carry out the distribution. Examples of signal bearing media include but are not limited to recordable type media such as floppy disks or CD ROMS, and transmission type media such as analog or digital communications links.

While the invention has been particularly shown and described with reference to a preferred embodiment, it will be understood by those skilled in the art that various changes in form and detail may be made therein without departing from the spirit and scope of the invention.

What is claimed is:

1. A method for encoding an input data stream of source symbols to produce an output sequence of pointers by utilizing a history-buffer within a data compressor, said method comprising the steps of:

encoding an initial part of said input data stream as a LITERAL_POINTER, wherein said LITERAL_POINTER includes at least one data byte from said data stream;

encoding a subsequent part of said input data stream as a COPY_POINTER, wherein said COPY_POINTER includes a count field and a displacement pointing to said history-buffer; and encoding succeeding data bytes from said input data stream as LITERAL_POINTERs and COPY_POINTERs in an alternating order, such that said output sequence from said data compressor includes a string of pointers alternating between LITERAL_POINTERs and COPY_POINTERs.

2. The method for encoding an input data stream of source symbols according to claim 1, wherein said LITERAL_POINTER includes a LITERAL_COUNT field followed by a corresponding number of LITERAL_DATA symbols.

3. The method for encoding an input data stream of source symbols according to claim 2, wherein said LITERAL_COUNT is of fixed length.

4. The method for encoding an input data stream of source symbols according to claim 2, wherein said LITERAL_COUNT is two bits.

5. The method for encoding an input data stream of source symbols according to claim 2, wherein said LITERAL_COUNT is of variable length.

6. The method for encoding an input data stream of source symbols according to claim 2, wherein said LITERAL_COUNT is one bit or two bits.

7. The method for encoding an input data stream of source symbols according to claim 1, wherein said count field is of variable length.

8. The method for encoding an input data stream of source symbols according to claim 7, wherein said count field is 2 to 12 bits.

9. A data compressor for encoding an input data stream of source symbols to produce an output sequence of pointers by utilizing a history-buffer, said data compressor comprising:

means for encoding an initial part of said input data stream as a LITERAL_POINTER, wherein said LITERAL_POINTER includes at least one data byte from said data stream;

means for encoding a subsequent part of said input data stream as a COPY_POINTER, wherein said COPY_POINTER includes a count field and a displacement pointing to said history-buffer; and means for encoding succeeding data bytes from said input data stream as LITERAL_POINTERs and COPY_POINTERs in an alternating order, such that said output sequence from said data compressor includes a string of pointers alternating between LITERAL_POINTERs and COPY_POINTERs.

10. The data compressor according to claim 9, wherein said LITERAL_POINTER includes a LITERAL_COUNT field followed by a corresponding number of LITERAL_DATA symbols.

11. The data compressor according to claim 10, wherein said LITERAL_COUNT is of fixed length.

12. The data compressor according to claim 10, wherein said LITERAL_COUNT is two bits.

13. The data compressor according to claim 10, wherein said LITERAL_COUNT is of variable length.

14. The data compressor according to claim 10, wherein said LITERAL_COUNT is one bit or two bits.

15. The data compressor according to claim 9, wherein said count field is of variable length.

16. The data compressor according to claim 15, wherein said count field is 2 to 12 bits.

17. A program software product for encoding an input data stream of source symbols to produce an output sequence of pointers by utilizing a history-buffer, said program software product comprising:

program code means for encoding an initial part of said input data stream as a LITERAL_POINTER, wherein said LITERAL_POINTER includes at least one data byte from said data stream;

program code means for encoding a subsequent part of said input data stream as a COPY_POINTER, wherein said COPY_POINTER includes a count field and a displacement pointing to said history-buffer; and program code means for encoding succeeding data bytes from said input data stream as LITERAL_POINTERs and COPY_POINTERs in an alternating order, such that said output sequence from said data compressor includes a string of pointers alternating between LITERAL_POINTERs and COPY_POINTERs.

18. The program software product according to claim 17, wherein said LITERAL_POINTER includes a LITERAL-COUNT field followed by a corresponding number of LITERAL_DATA symbols.

19. The program software product according to claim 18, wherein said LITERAL_COUNT is of fixed length.

20. The program software product according to claim 18, wherein said LITERAL_COUNT is of variable length.

* * * * *